United States Patent
Paagman

[11] Patent Number: 5,924,899
[45] Date of Patent: Jul. 20, 1999

[54] MODULAR CONNECTORS

[75] Inventor: Bernardus L. F. Paagman, Schijndel, Netherlands

[73] Assignee: Berg Technology, Inc., Reno, Nev.

[21] Appl. No.: 08/974,536

[22] Filed: Nov. 19, 1997

[51] Int. Cl.⁶ .................................................. H01R 13/502
[52] U.S. Cl. .............................. 439/701; 439/79; 439/620
[58] Field of Search ............................... 439/79, 607, 608, 439/372, 570, 701, 76.1, 620

[56] References Cited

U.S. PATENT DOCUMENTS

| | | |
|---|---|---|
| 3,035,244 | 5/1962 | Aveni . |
| 3,208,028 | 9/1965 | Mittler et al. . |
| 3,432,801 | 3/1969 | Ruotolo . |
| 3,564,343 | 2/1971 | Guest et al. .............................. 317/101 |
| 4,008,941 | 2/1977 | Smith . |
| 4,017,770 | 4/1977 | Valfre ...................................... 361/399 |
| 4,148,543 | 4/1979 | Shores . |
| 4,157,612 | 6/1979 | Rainal ........................................ 29/628 |
| 4,206,963 | 6/1980 | English et al. . |
| 4,265,549 | 5/1981 | Cote ........................................ 400/124 |
| 4,382,653 | 5/1983 | Blanchard . |
| 4,457,574 | 7/1984 | Walters . |
| 4,477,022 | 10/1984 | Shuey et al. . |
| 4,571,014 | 2/1986 | Robin et al. . |
| 4,689,721 | 8/1987 | Damerow et al. ....................... 361/388 |
| 4,806,107 | 2/1989 | Arnold et al. ............................ 439/79 |
| 4,846,727 | 7/1989 | Glover et al. ............................ 439/608 |
| 4,861,272 | 8/1989 | Clark .......................................... 439/79 |
| 4,975,084 | 12/1990 | Fedder et al. ............................ 439/608 |
| 5,055,069 | 10/1991 | Townsend et al. ...................... 439/608 |
| 5,066,236 | 11/1991 | Broeksteeg ................................ 439/79 |
| 5,104,341 | 4/1992 | Gilissen et al. .......................... 439/608 |
| 5,118,300 | 6/1992 | Zerreli ........................................ 439/79 |
| 5,383,095 | 1/1995 | Korsunsky et al. ..................... 361/785 |
| 5,429,520 | 7/1995 | Morlion et al. .......................... 439/108 |
| 5,454,738 | 10/1995 | Lim et al. ................................ 439/676 |
| 5,470,244 | 11/1995 | Lim et al. ................................ 439/189 |
| 5,522,727 | 6/1996 | Saito et al. ................................ 439/65 |
| 5,605,477 | 2/1997 | Wu et al. ................................. 439/620 |

FOREIGN PATENT DOCUMENTS 0 442 643 B1  2/1991  European Pat. Off. ........ H01R 23/68

OTHER PUBLICATIONS

IBM Technical Disclousre Bulletin—Shielded In–Line Electrical Multiconnector vol. 10 No. 3 Aug. 1967.

*Primary Examiner*—Khiem Nguyen
*Attorney, Agent, or Firm*—Brian J. Hamilla; M. Richard Page

[57] ABSTRACT

Modular connectors employ terminal carriers for gang mounting of terminals onto circuit substrates. The carriers may be shielded for providing shielding through the connector. Substrate mounting systems include press fit, floating surface mount, solder ball and intrusive reflow arrangements.

29 Claims, 15 Drawing Sheets

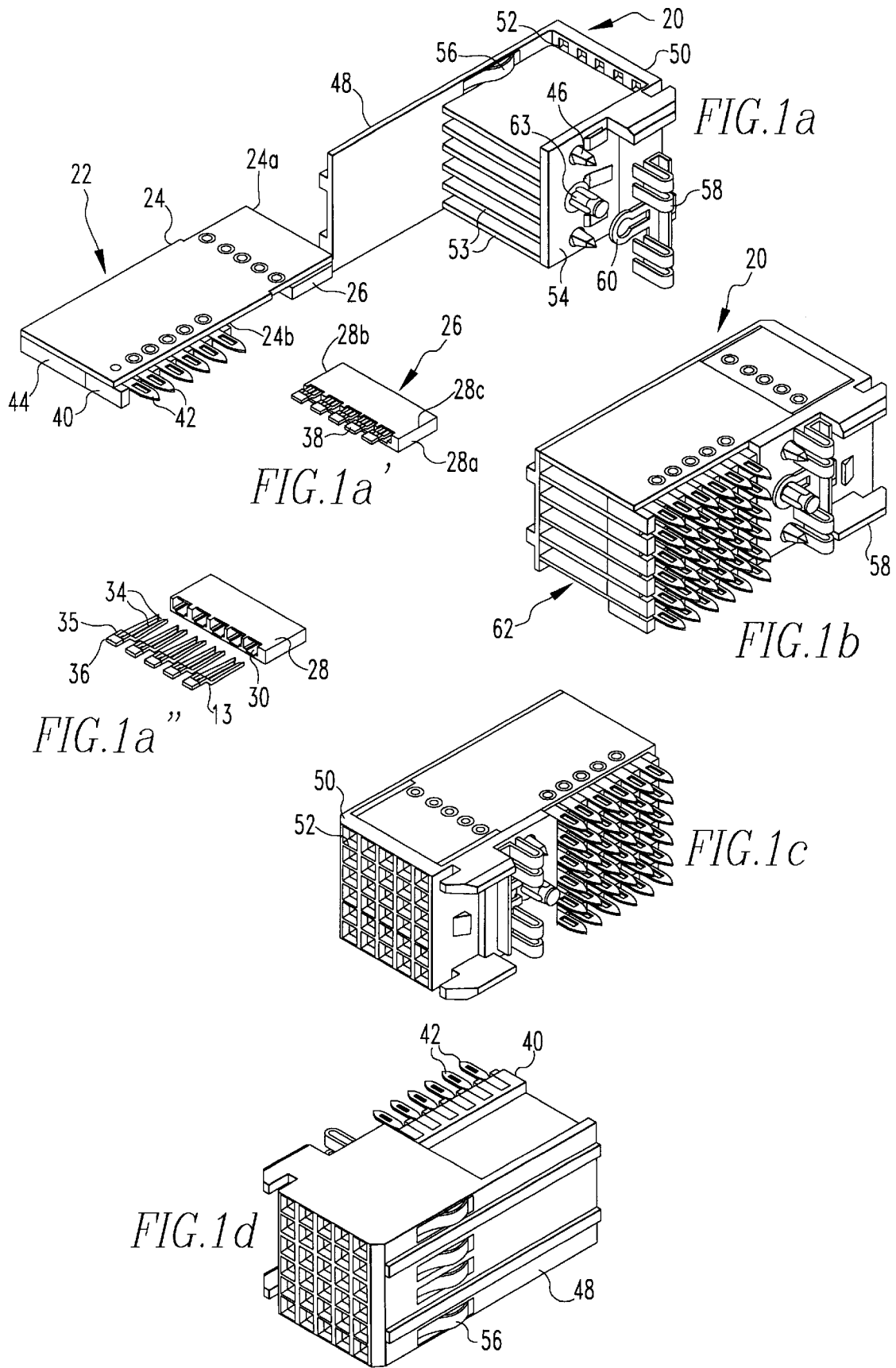

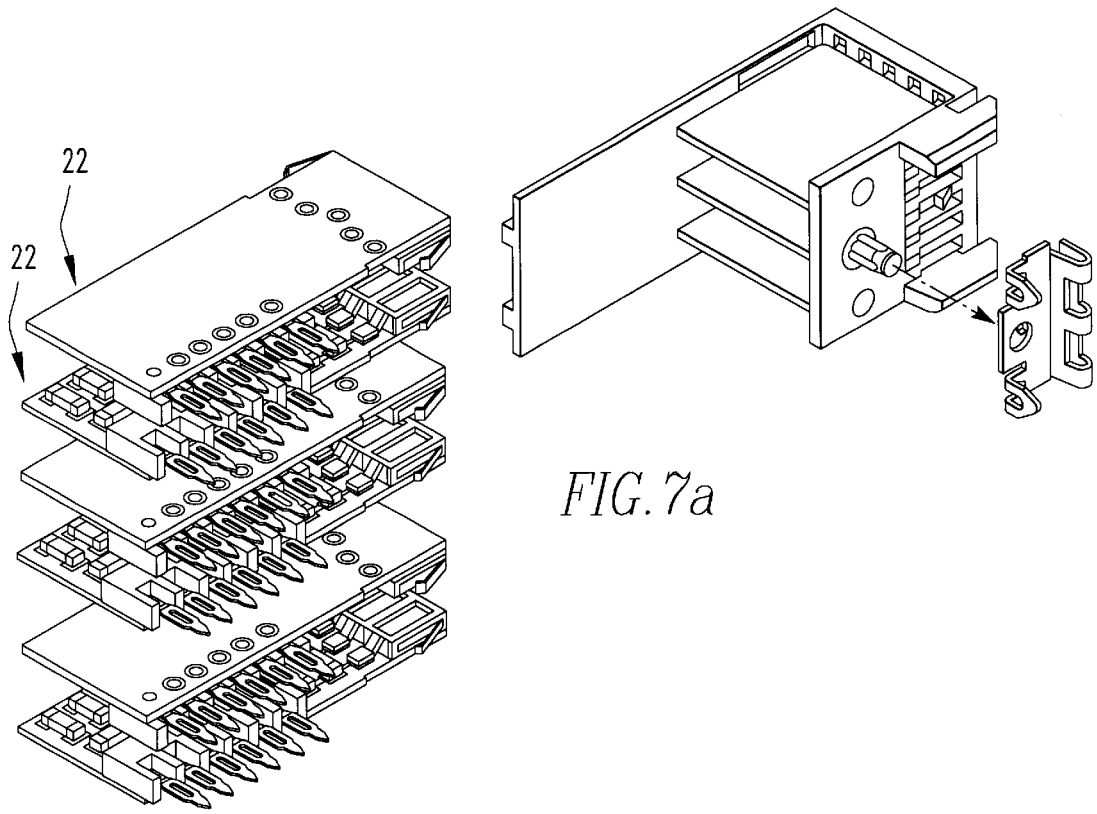
FIG. 7a
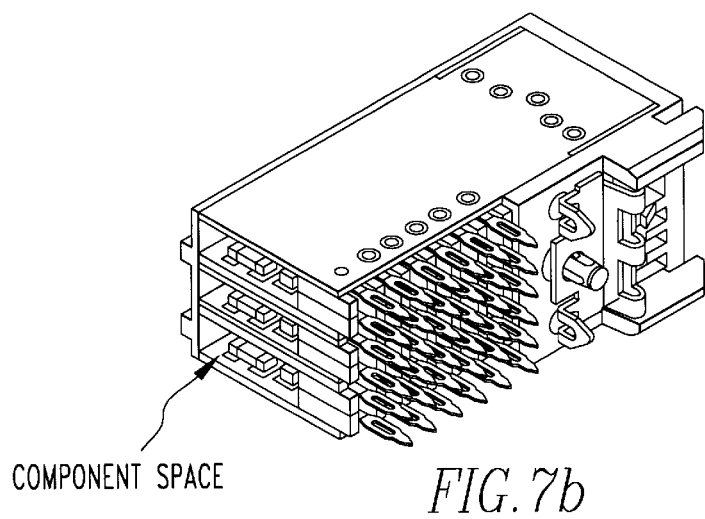
COMPONENT SPACE   FIG. 7b

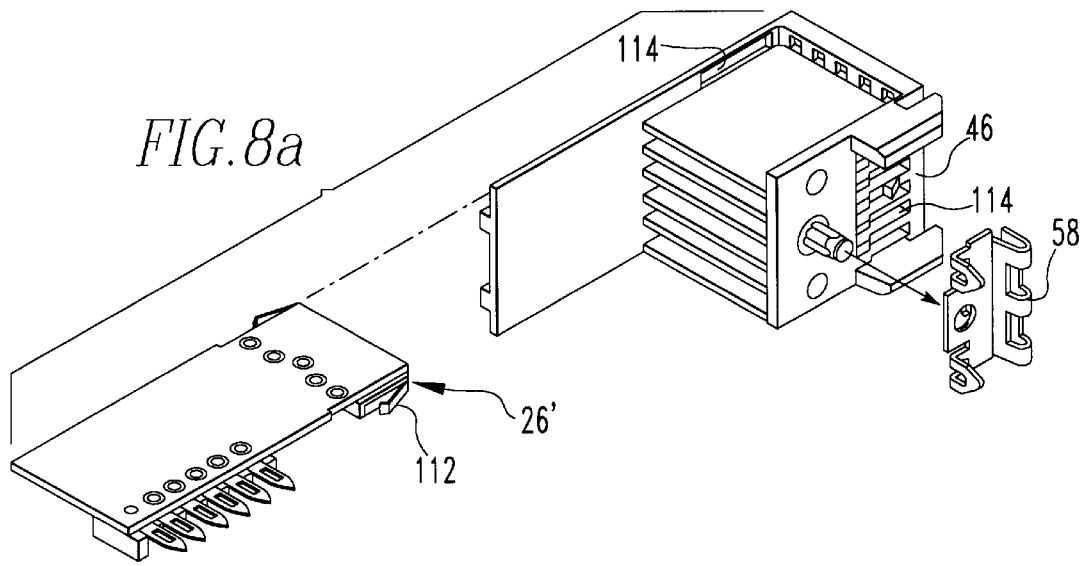
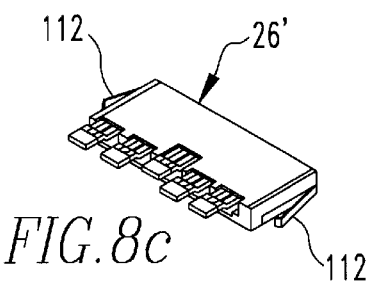
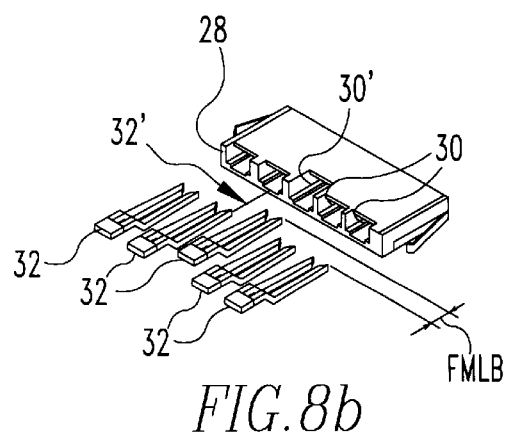

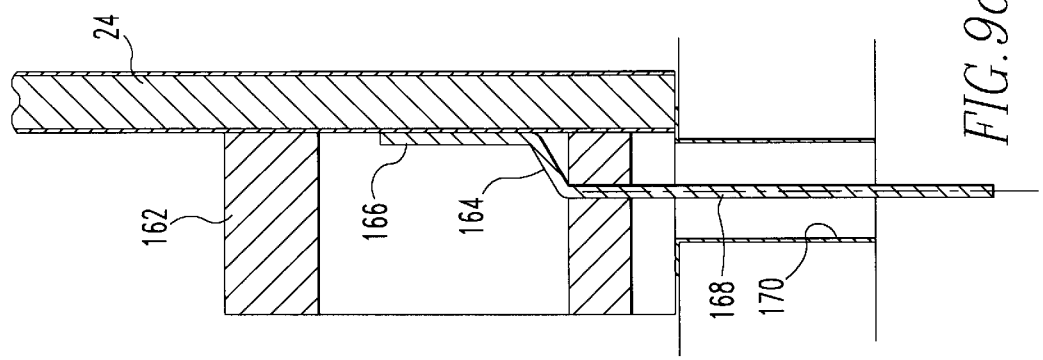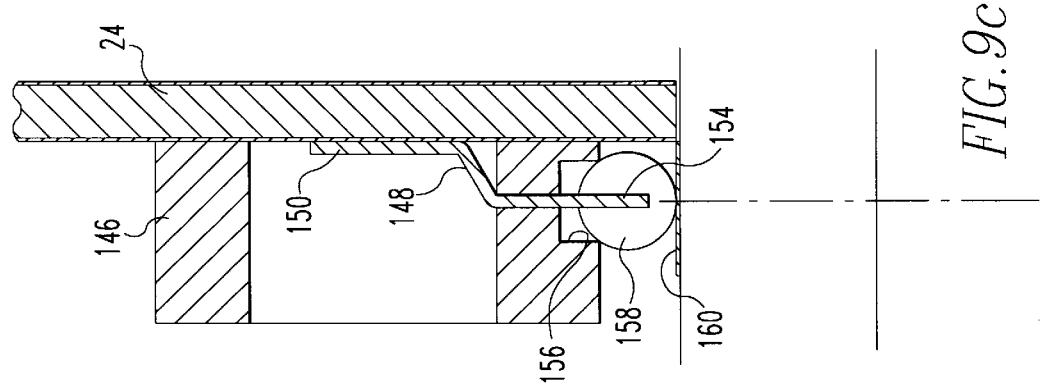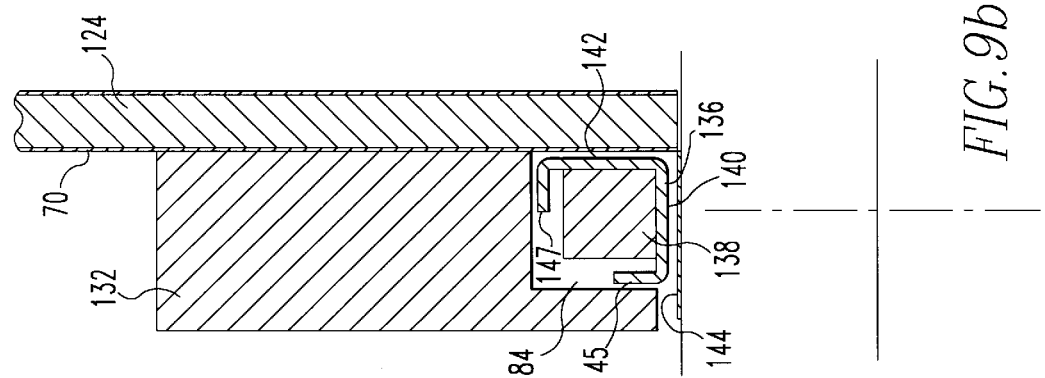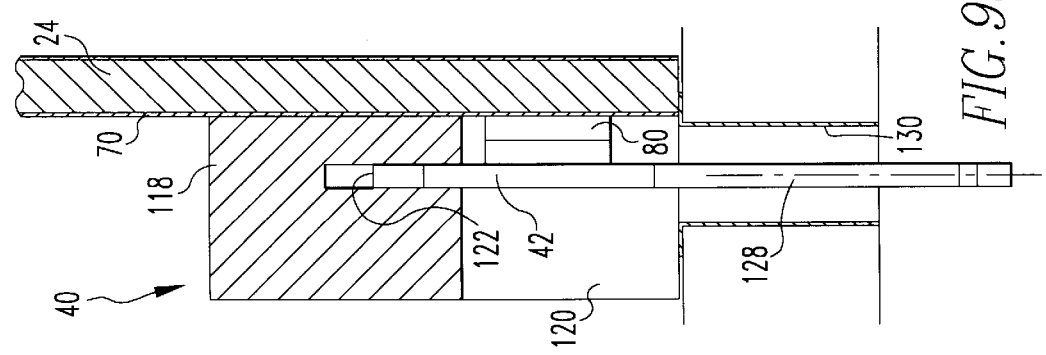

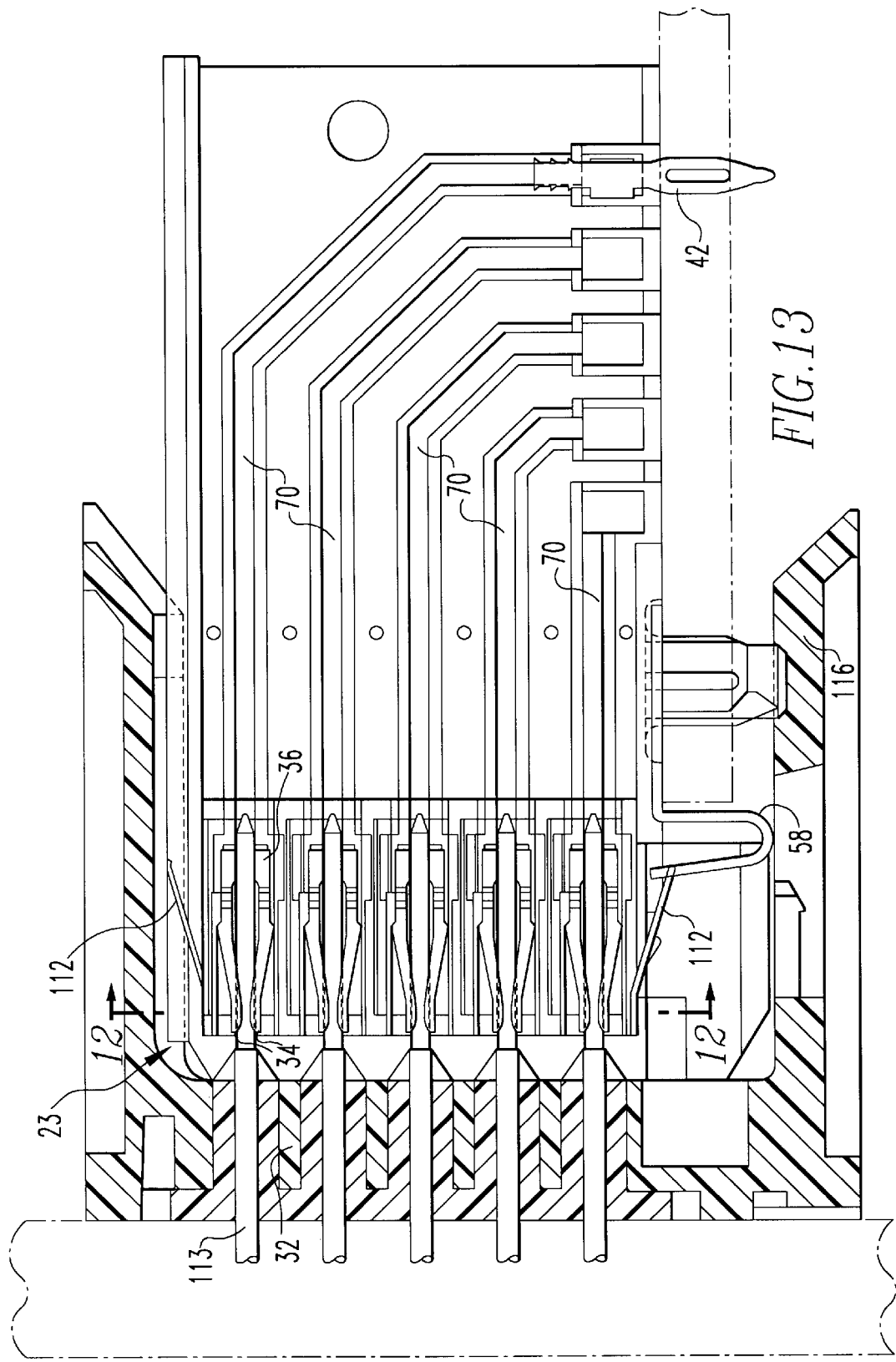

MODULAR CONNECTORS

BACKGROUND OF THE INVENTION

1. Field of the Invention

This invention relates to electrical connectors. Specifically, it relates to electrical connectors constructed of a plurality of circuit substrate modules, to which mating terminals and other components may be attached.

2. Brief Description of Prior Developments

Connectors formed of printed circuit boards arranged in side by side relationship have been disclosed. One such system is shown in U.S. Pat. No. 4,521,014. However, the construction shown in this patent would be expensive to produce and difficult to miniaturize.

Published European Patent Application Serial No. 0 752 739 (commonly owned by the assignee of the present invention and incorporated herein by reference) discloses a modular connector system using side by side stacked circuit substrates to form miniaturized, high speed connectors capable of being manufactured at lower cost.

U.S. application Ser. No. 08/784,743 filed Jan. 16, 1997 illustrates modular connectors of a similar type used to form high speed cable interconnections. U.S. patent application Ser. No. 08/784,744 filed Jan. 16, 1997 illustrates arrangements for surface mounting such high speed connectors. Both of these applications are commonly owned by the assignee of the present application and are incorporated herein by reference.

However, a need exists to increase the high frequency performance of these systems and reduce the manufacturing costs. Regarding performance, current widely commercial backplane connector systems having a 2 mm grid pitch run at levels of 10% cross talk at 500 picosecond rise times (0.7 GHz). Electrically enhanced versions of these systems approach a performance level of 6% cross talk at 500 picosecond rise times. However, for data transmission especially performance levels of 1% cross talk at signal rise times of 60 to 100 picoseconds (3.5 to 6 GHz) are desirable for systems meant to carry digital signals at a 2.5 Gigabits/second rate.

SUMMARY OF THE INVENTION

This invention relates to electrical connectors and interconnection systems formed in a modular fashion from stacked assemblies of circuit substrate elements. Contact terminals, especially receptacle terminals are provided with shielding in the mating region of the terminal. High cross talk performance is achieved by shielding that can be carried through the interconnection, with also the possibility of incorporating signal conditioning elements in the connector.

Manufacturing costs are improved by providing terminal carriers for holding a plurality of terminals in position to be mounted on the circuit substrate simultaneously. The carriers can be designed to function as a means for retaining modules in a housing and/or transmitting insertion force to press fit terminals.

BRIEF DESCRIPTION OF THE DRAWINGS

FIGS. 1a, 1a', 1a", 1b, 1c and 1d are isometric views of the various components of a right angle receptacle connector made in accordance with the invention;

FIGS. 6a and 6b show another embodiment of cable connector module similar to that shown in FIG. 4a;

FIGS. 7a and 7b are isometric views of a right angle receptacle connector arranged for differential signal pairs;

FIG. 8a is an isometric exploded view of a right angle receptacle connector having shielded receptacle contacts;

FIGS. 8b and 8c are isometric views of a receptacle carrier having first make, last break functionality;

FIG. 9a, 9b, 9c an 9d shown several variants of terminal carriers for forming connections to printed circuit boards;

FIG. 10 is a front elevational view of the terminal carrier shown in FIG. 9a;

FIG. 13 is a side elevational view of the right angle connector shown in FIG. 8a, mated with a header connector;

DETAILED DESCRIPTION OF THE PREFERRED EMBODIMENTS

Figure 2A:
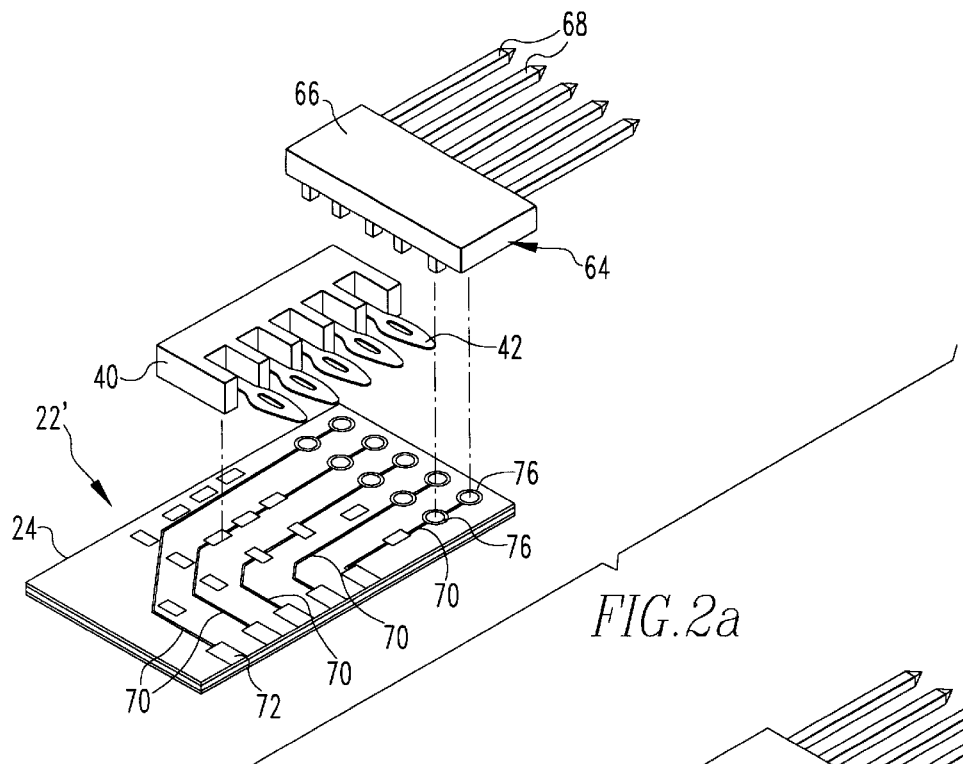
FIGS. 2a and 2b are isometric views of components of a right angle header module.

FIG. 1a shows an exploded view of a right angle receptacle connector embodying features of the invention. The connector 20 includes a plurality of circuit modules 22. Each module 22 includes a circuit substrate 24 that can be formed of a substantially planar piece of printed circuit board material, such as that sold under the commercial designation FR4, or other suitable materials. Also, the substrate 24 can be formed of a molded or cast piece of a suitable insulative material, especially one receptive to or easily treated to be receptive to the formation of conductive traces on its surface. The substrate 24 carries a plurality of conductive traces (see FIG. 2a) extending from the region of one edge, such as edge 24a to the region of a second edge, such as edge 24b. Preferably, ground tracks are interlaced with the terminal traces for shielding of these traces. In addition, the side of the substrate 24 opposite the side carrying the circuit traces (the side disposed upwardly in FIG. 1a) is covered with a continuous shielding or ground layer. Such constructions are disclosed in above-noted published European patent application.

Each module has one or more sets of terminals secured on its track receiving side. In the embodiment illustrated in FIG. 1a, one terminal set comprises a receptacle terminal assembly 26. As shown in exploded view in FIG. 1a", the terminal carrier 26 comprises a housing 28 of insulative material having a plurality of aligned openings 30. A receptacle terminal, such as a tuning fork terminal 32, is received in each of the openings 30 and is retained therein by retentive barbs 33 on side edges of the terminals. The tines 34 of the terminals extend through an offset region 35 to a base section 36 having a surface 38 adapted to be surface mounted on a conductive trace of the substrate 24. Preferably, the surfaces 38 are arranged to be substantially coplanar with the top surface 28c of the housing 28. Suitable location and retention structure, such as locating/mounting pegs (not shown) may be formed on the housing 28 to aid in location and retention of the terminal carrier on the circuit substrate 24.

Similarly, a press fit terminal carrier 40 having a plurality of press fit terminals 42 may be mounted along edge 24b. The press fit terminal carrier 40 may also include an extension 44 that comprises structure for transmitting press fit insertion force to the terminals 14. Terminal carriers 26 and 40 are described in greater detail below.

The connector 20 also includes an insulative housing 46. The housing 46 includes a top wall 48 and a front wall 50 having a plurality of a leading apertures 52 position to be aligned with the receptacle terminals 32. A plurality of interior walls 53 extend between the top wall 48 and the bottom wall 54 to form a plurality of parallel stacked compartments, each of which receives one of the circuit modules 22. The housing can include a plurality of ground springs 56 for establishing a ground connection between the circuit modules 22 and a mating connector. Alternatively, as described later, the ground springs 56 can be carried by terminal carrier 26.

As shown in FIG. 1b, a plurality of circuit modules 22 are inserted into the housing 46 to form a completed right angle connector. Preferably, the modules are retained in the housing by means of an interference fit between the housing and portions of the modules. Such an interference fit may be created by sizing terminal carrier 26 and/or the press fit carrier 40 in their thickness or width dimensions, or both, so that there is a suitable interference fit with the slots between the dividing walls 53. The modules 22 are supported so that there are spaces 62 between each of the modules. Such spacing allows for other components to be mounted on the module 24, as will be later explained. The connector 20 may also include an additional ground spring 58, that is adapted to ground the connector to the printed circuit board on which it is mounted. The ground spring 58 is retained by a mounting structure 60 that is received on the locating post 63. Grounding can be carried from modules 22 through contact springs (not shown) similar to ground springs 56, that contact ground spring 58.

As previously described, the press fit terminal carrier 40 may include a force transmitting extension 44 that is adopted to bear against the bottom surface of the housing top 48. Thus, when a press fit insertion force is applied to the top 48, that force is applied directly, through extension 44, to the carrier housing 40 to push the press fit terminals 42 into the circuit board. This avoids applying shear stress directly to the solder interface between the terminals 42 and the circuit substrate 24. Alternately, an insertion force may be applied directly to housing 40 by appropriate tooling.

FIG. 1c is an isometric view of the connector shown in 1b taken from the front of the connector, showing the front face 50 with lead-in apertures 52. FIG. 1d is an isometric view showing the top view of the connector 20, with grounding springs 56 extending through slots in the top 48 of the housing and positioned to engage shielding contacts of a mating header.

Figure 2B:
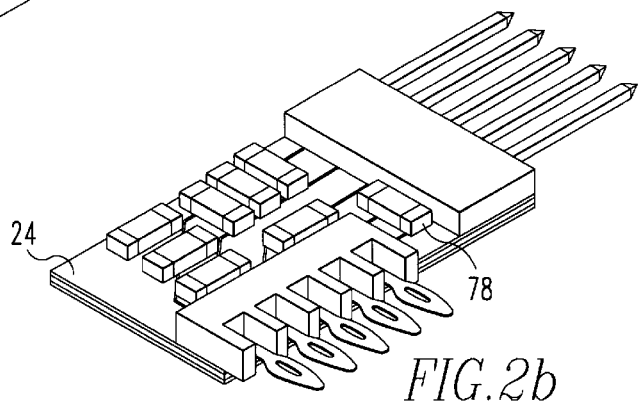
Figure 2C:
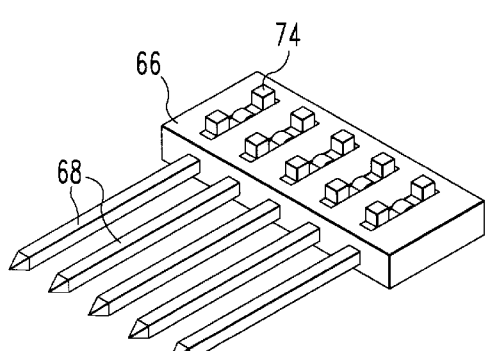
FIGS. 2c and 2d are isometric views of terminal blocks or carriers used in the module shown in FIG. 2b.
Figure 2D:
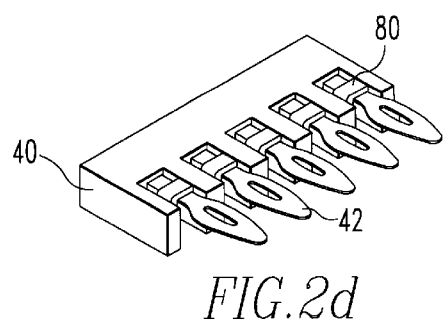
Figure 14B:
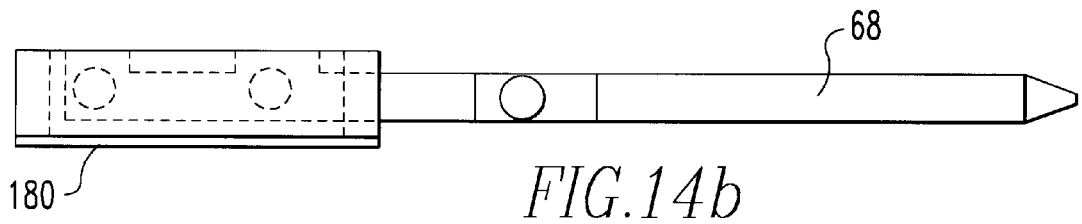
FIGS. 14a and 14b are top and side views respectively of a shielded pin carrier for surface mounting on a circuit module.

Referring to FIGS. 2a and 2b, there is illustrated a module 22' that is similar to the receptacle module illustrated in FIG. 1a, with the primary difference being that, in place of the receptacle carrier 26, a pin carrier 64 comprising an insulation body 66 and a plurality of contact pins 68, is mounted on circuit substrate 24. As shown in FIG. 2a, the circuit substrate 24 has a plurality of circuit traces 70 formed thereon. The press fit terminal carrier 40 is secured on one edge of the board with the press fit terminals 42 attached to contact pads 72. The pin carrier 64 is applied to another edge of the circuit substrate. In one variant, the pin header 64 may have one or more contact pins 74 that extend beyond the lower surface of body 66 as shown in FIG. 2c. The pins 74 are adapted to be received in plated through-holes 76 in the circuit substrate. Alternately, the contacts 74 can be substantially flush with the bottom surface of the carrier body 66 (as shown in FIG. 14b), thereby providing for surface mounting of the pin carrier 64 onto the circuit substrate 24. As shown in FIG. 2d, the circuit substrate 24 may be populated with appropriate passive or active electronic elements 78 for purposes of signal conditioning or modifying signals carried by conductive traces 70.

As shown in FIG. 2d, the press fit carrier 40 includes press fit terminals 42 that have surface mounting pads 80 substantially coplanar with the bottom surface of the carrier 40. The pads 80 may be integrally formed with the press fit pins 42, for example by bending an integral tab in a U-shape to form the pad 80.

Figure 3A:
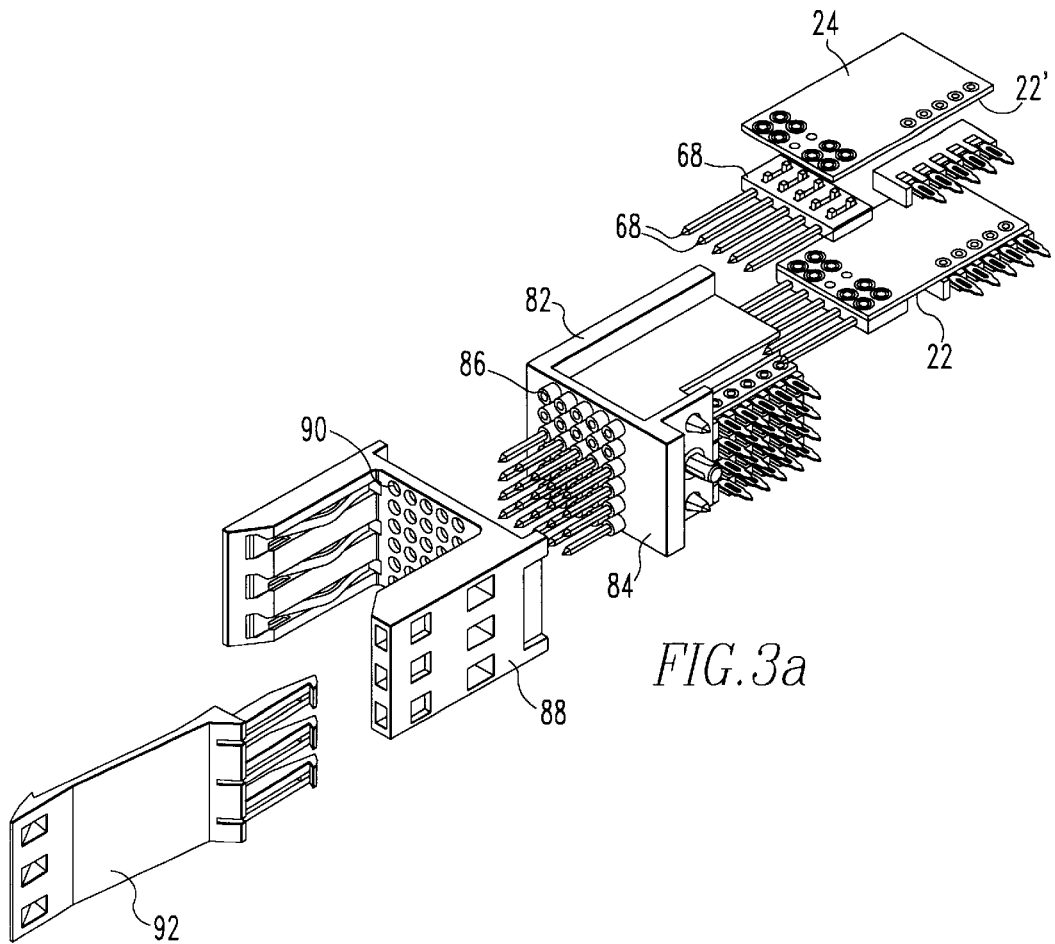
FIGS. 3a and 3b are isometric views of a right angle header using the module shown in FIG. 2b.
Figure 3B:
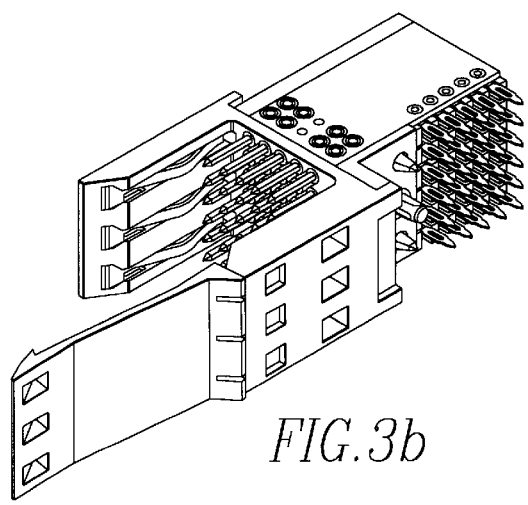

As shown in the exploded view of FIG. 3a and assembled view of FIG. 3b, a suitable header connector may be formed from the modules 22 in essentially the same manner as described with respect to the receptacle connector 20. In this form of a connector, a body 82 of insulative material is formed in a similar manner to the housing 46 of FIG. 1a, with the exception that the front wall 84 of the housing 82 includes an array of integrally formed insulating ferrules 86. A shroud 88 is mounted onto the insulative housing 82, with the ferrules 86 received in openings 90 in the base of the shroud. The shroud in this embodiment is formed of a conductive material, such as a die cast zinc, for shielding purposes. A latch structure 92 may be secured onto the shroud 88 for purposes of latching a cable connector onto the shroud.

Figure 4A:
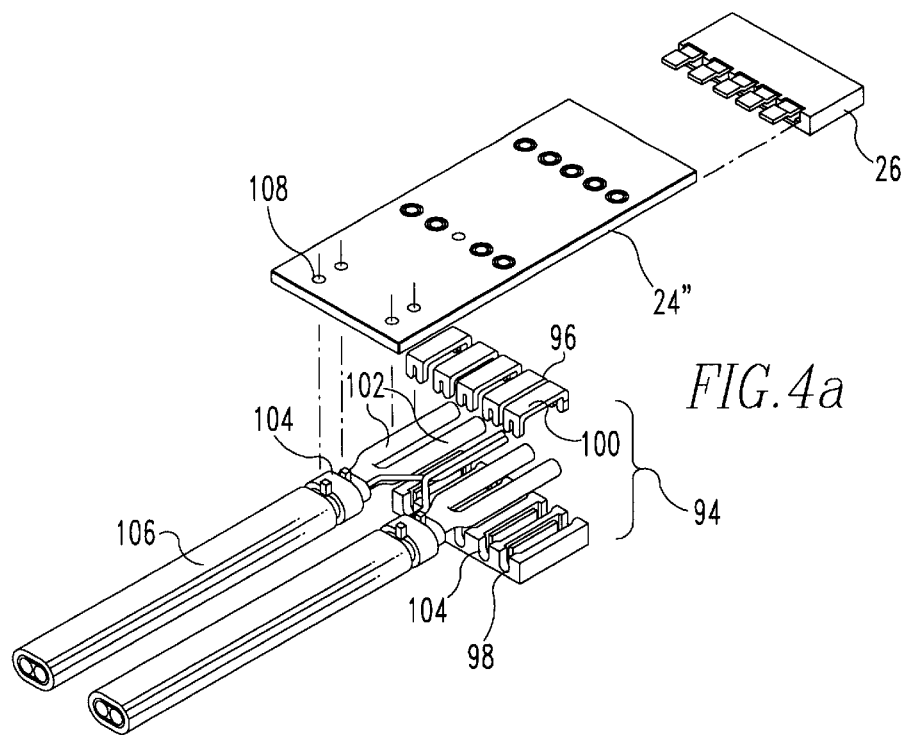
FIGS. 4a, 4b and 4c are isometric views of a module or parts thereof used for forming cable connectors.
Figure 4B:
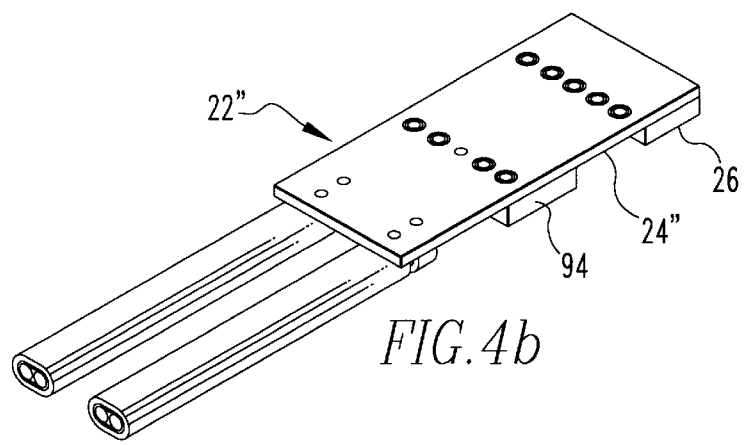
Figure 4C:
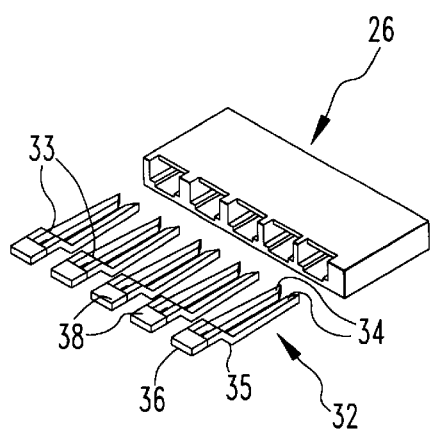

FIGS. 4a, 4b and 4c illustrate a module 22" for forming a cable connector. In this version, the circuit substrate 24" includes a receptacle carrier 26 generally of the same type as illustrated in FIG. 1a having a plurality of tuning fork contacts 32. At the end of the substrate 24" opposite the terminal carrier 26, is an insulation displacement contact (IDC) carrier 94 that includes a plurality of insulation displacement contacts 96 received in an insulative cover 98. The bottom surfaces 100 of the IDC terminals are adapted to be surface mounted onto the circuit substrate 24". As is conventional, the terminals 96 are assembled to the cover 98, with the cover positioned to allow insertion of conductors 102 into channels 104 in the cover. To attach the conductors, the cover is pushed toward the terminals 96, causing the conductors 102 to be driven into the IDC contacts 96 and thereby causing the upstanding portions of the terminals to slice through insulation surrounding the conductors 102, as is conventional in such type connectors. Drain wires 105, if present may also be placed in one of the IDC contacts 96. For additional securing of the cables, metal strain relief ferrules 104 may be applied to the cable 106. The strain relief ferrules 104 may be secured to the substrate 24" by means of pegs or by soldering through vias 108 in the substrate 24". A cable connector module 22" is formed as shown in FIG. 4b by applying the receptacle carrier 26 and the IDC terminal carrier 94 to the substrate 24". FIG. 4c illustrates a receptacle carrier 26 of essentially the same type as shown in FIG. 1a. It should be noted that the opposed cantilever sections of each tuning fork terminal formed by the tines 34 and offset portions 35, are joined together at the base 36. The plane of base 36 is offset from the plane of portions 34 by the offset defined by the portions 35. The amount of the offset is sufficient for a signal pin to be received between forks 34 and to pass next to base 36, as shown in FIG. 13.

Figure 5A:
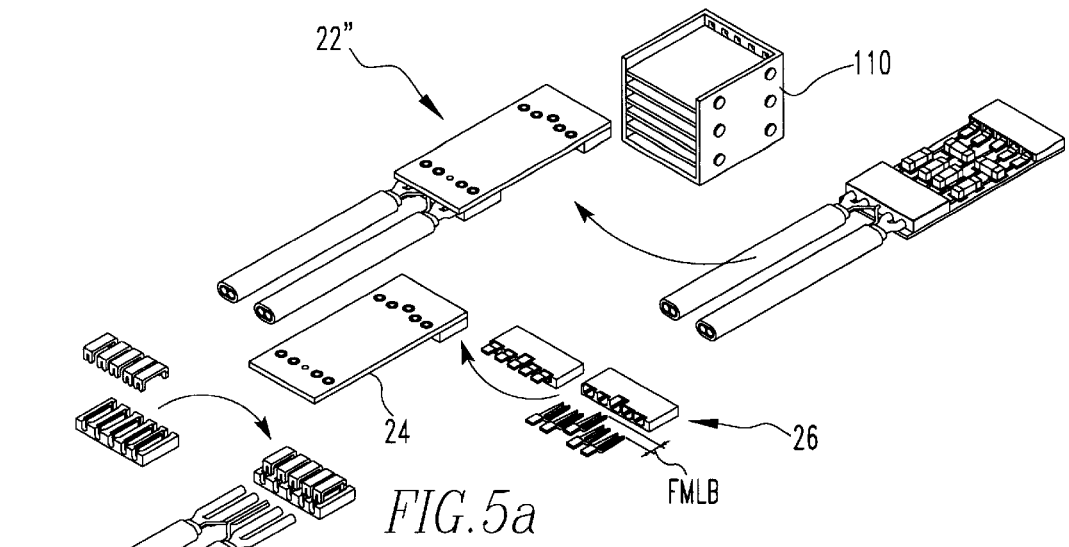
FIGS. 5a, 5b and 5c are isometric views of a receptacle cable connector using modules of the type shown in FIG. 4b.
Figure 5B:
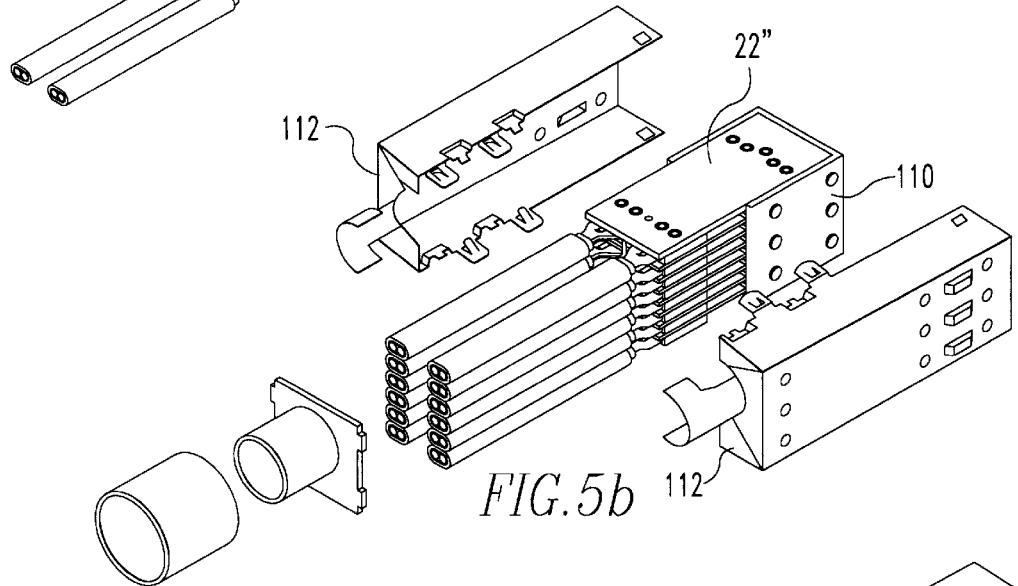
Figure 5C:
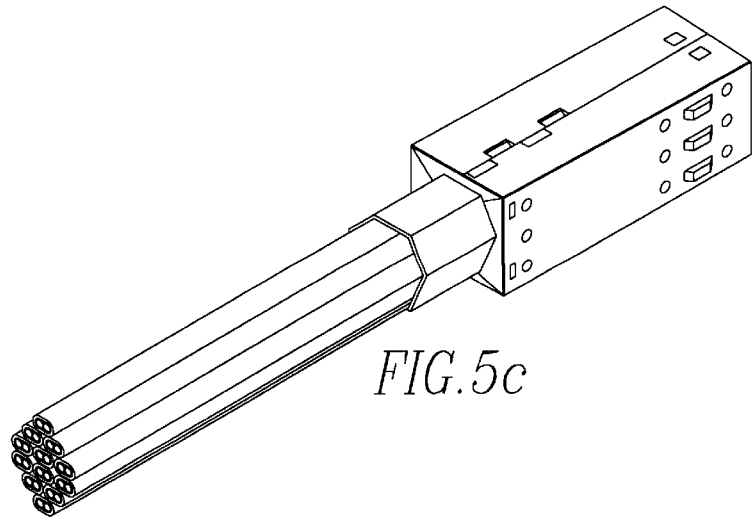

As shown in FIGS. 5a, 5b and 5c, a cable connector may be formed by inserting a plurality of cable connector modules 22" into a cable connector housing 110 formed of an insulative material and having a plurality of parallel slots 111 for receiving the modules 22". As shown in FIG. 5b, a plurality of modules 22" are fit into the housing 110. A shielded connector is formed by securing metal shields 112, with a suitable strain relief structure about the unit formed by the housing 110 and the modules 22". The assembled, fully shielded cable connector is shown in FIG. 5c.

Figure 6A:
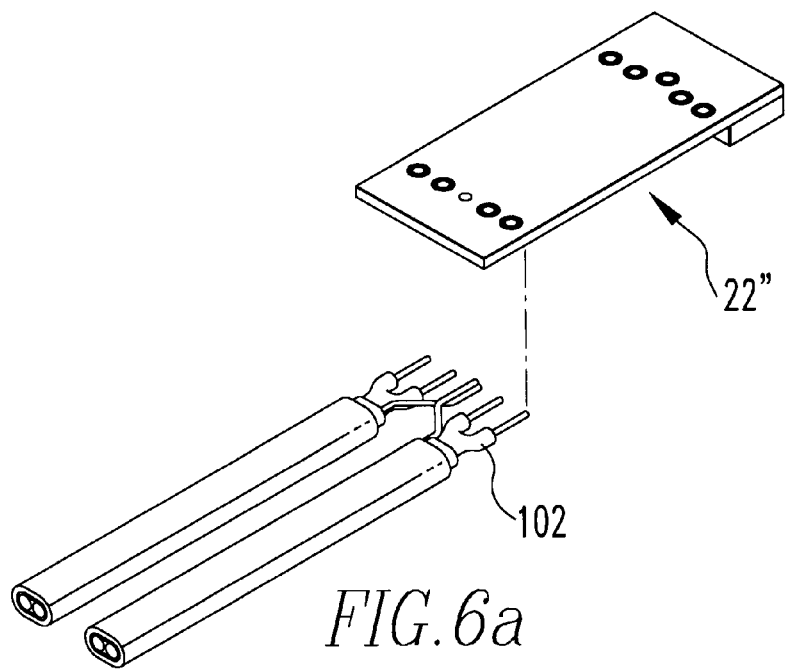
Figure 6B:
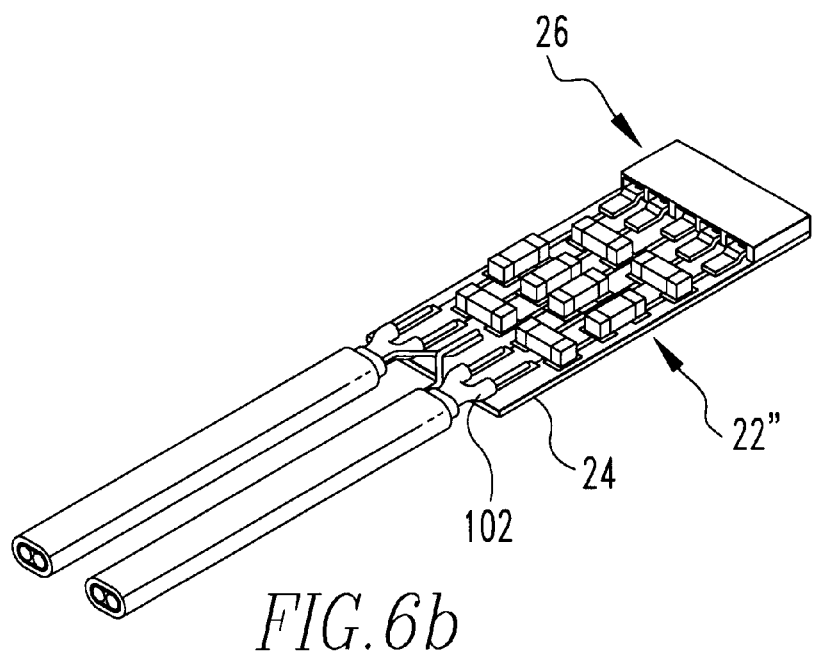

FIGS. 6a and 6b illustrate another form of cable connector module 22" similar to that shown in FIG. 5a except that, instead of the insulation displacement carrier 94, the conductors 102 are stripped and soldered directly onto appropriate contact pads on the circuit substrate.

FIGS. 7a and 7b illustrate a receptacle printed circuit board connector essentially as shown in FIG. 1 with the exception that the modules are placed in alternating orientation to provide for a differential pair arrangement.

FIG. 8a is an exploded view of an alternative embodiment to the right angle receptacle connector shown in FIG. 1a. In this embodiment, the receptacle contact carrier 26' includes a surrounding metal shield having contact springs 112 integrally formed with a shield, as will be later described. Contact springs 112 extend through slots 114 in the housing 46.

FIG. 8b illustrates a modified form of receptacle terminal carrier useful with the FIG. 8a receptacle embodiment, as well as with other receptacle embodiments. The carrier 26' has a body 28 having a plurality of terminal receiving openings 30. One of the openings, 30', is relieved along the top edge. The relief allows the center tuning fork terminal 32 to be positioned forwardly of the other terminals 32 by a distance FMLB. This provides the receptacle assembly with the capability of a "first make, last break" function with the mating terminal pins, whereby the center pin of an equal length set of pins will engage terminal 32 before the remaining pins engage terminals 32 during mating and will remain in contact with terminal 32' after the remaining pins separate from terminals 32 during unmating. This functionality is provided on the receptacle side of the connector and avoid the need for using unequal pin lengths in the mating header.

Figure 10:
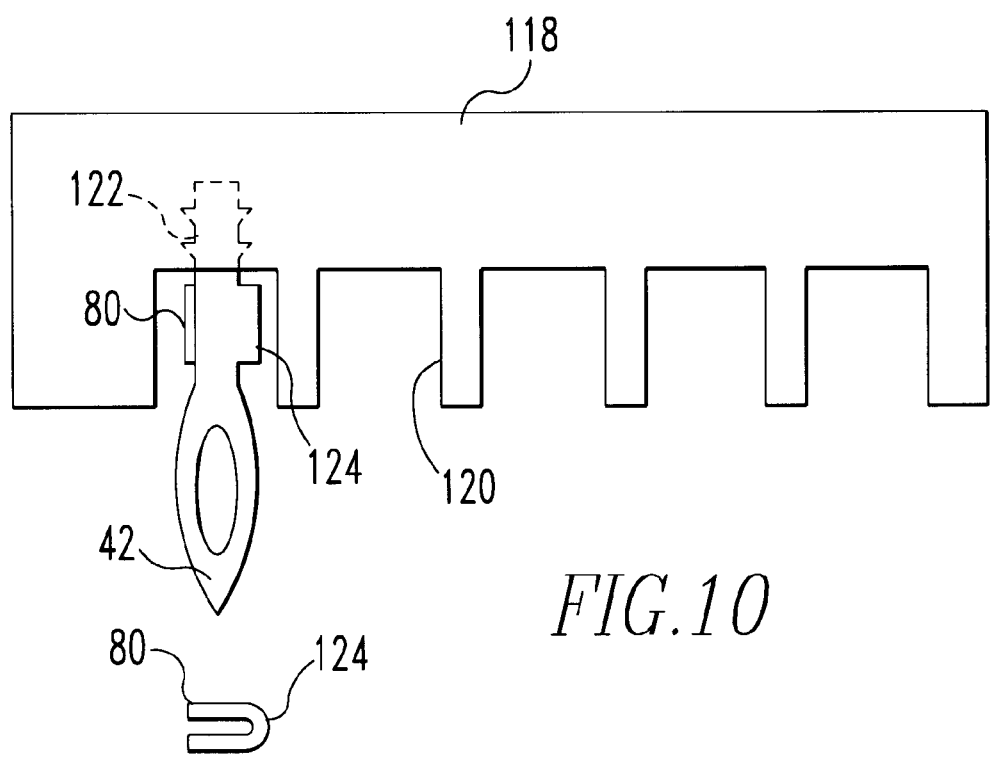

FIG. 9a is a cross sectional view of a press fit terminal carrier, such as carrier 40 previously described. In this arrangement, the body 118 of insulative material has a plurality of slots 120 (FIG. 10) in each of which is received a press fit pin 42. Each pin 42 includes a retention section 122 having barbs for retaining the terminal. Each terminal further includes a tab 124 that is bent into a U-shape to form a surface mounting pad 80 that is soldered onto a contact pad on the circuit substrate 24. The press fit section 128 may be formed in a suitable shape, such as an eye of the needle shape, to be retained in a through-hole 130, by being pressed therein, as is conventional.

In another form of mounting illustrated in FIG. 9b, an insulative body 132 includes a plurality of channels 134 formed along a bottom edge thereof. A plurality of surface mount terminal members 136 are wrapped about a core section 138 to form surface mount surfaces 140 and 142 that are adapted to be surface mounted respectively to a contact pad 144 on the printed circuit board or a contact pad on a trace of the circuit substrate 24. The terminal members 136 can float somewhat and are maintained on body 132 by the bent portions 145 and 147.

In another variant shown in FIG. 9c, insulative body 146 has a metallic terminal 148 mounted therein. The terminal 148 includes a surface mount portion 150 adapted to be soldered onto the circuit substrate 24. An opposite end 154 of the terminal extends into a well 156 and has a fusible element, such as a solder ball 158, secured thereto. The solder ball 158 is adapted, upon reflow, to effect a solder connection with contact pad 160 on the printed circuit board.

Another embodiment of printed circuit board mounting is shown in FIG. 9d. The insulative housing 162 has a metallic solder terminal 164 secured therein. The terminal 164 has a surface mount portion 166 adapted to be surface mounted onto the circuit substrate 24. A tail portion 168 is adapted to extend into a plated through-hole 170. Using intrusive reflow techniques, solder paste received in the through-hole 170 fuses the tail section 168 into electrical communication with the plated through-hole 170.

Figure 11A:
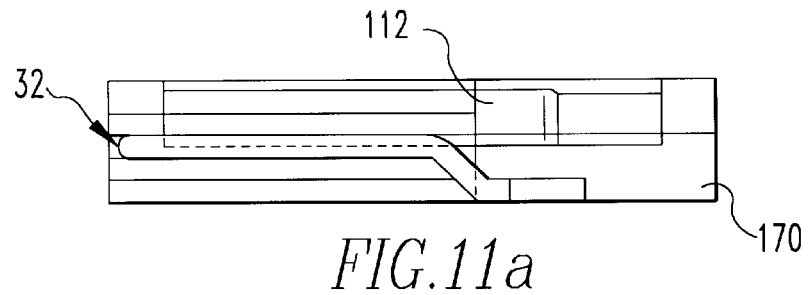
FIG. 11a is a top elevation of a shielded receptacle carrier and FIG. 11b is a side elevational view of that carrier.
Figure 11B:
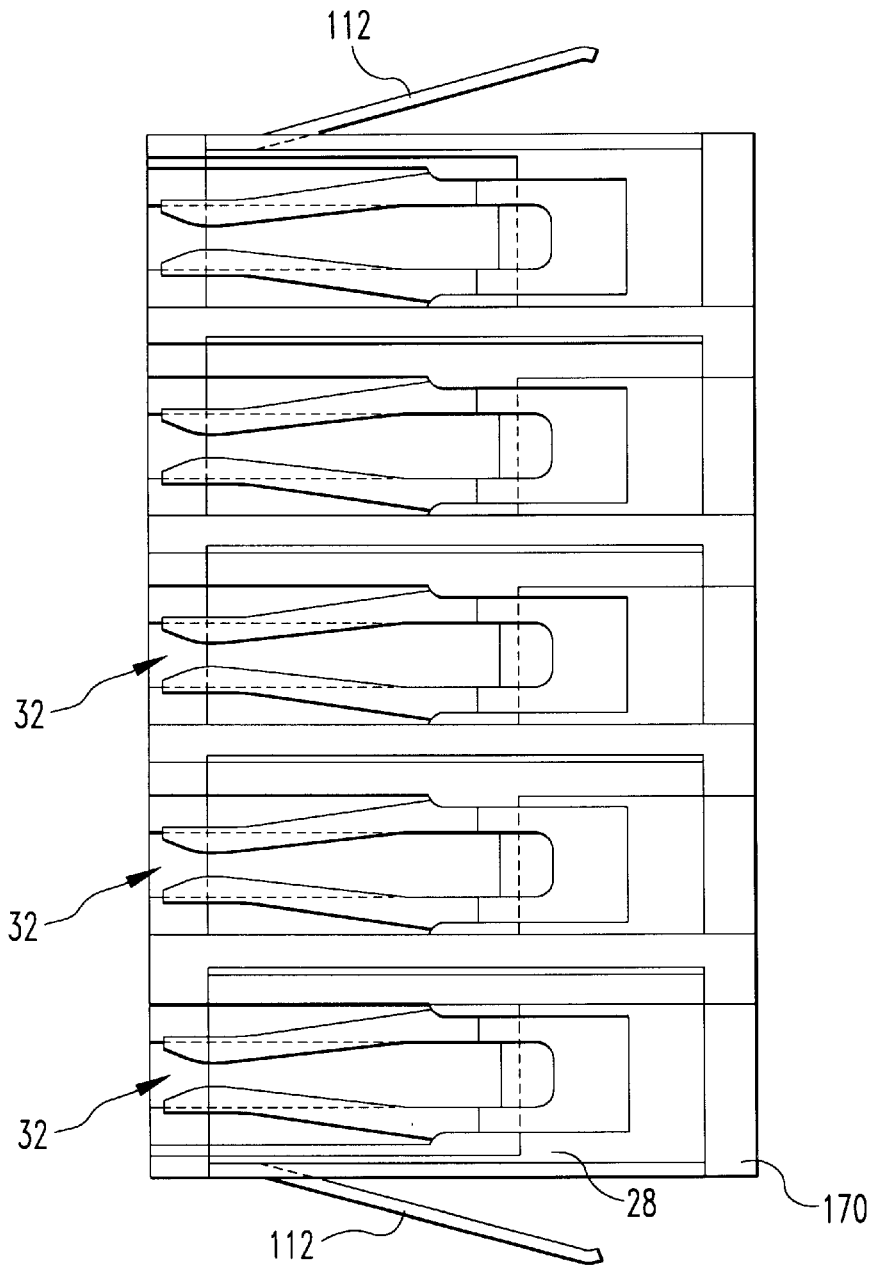
Figure 12:
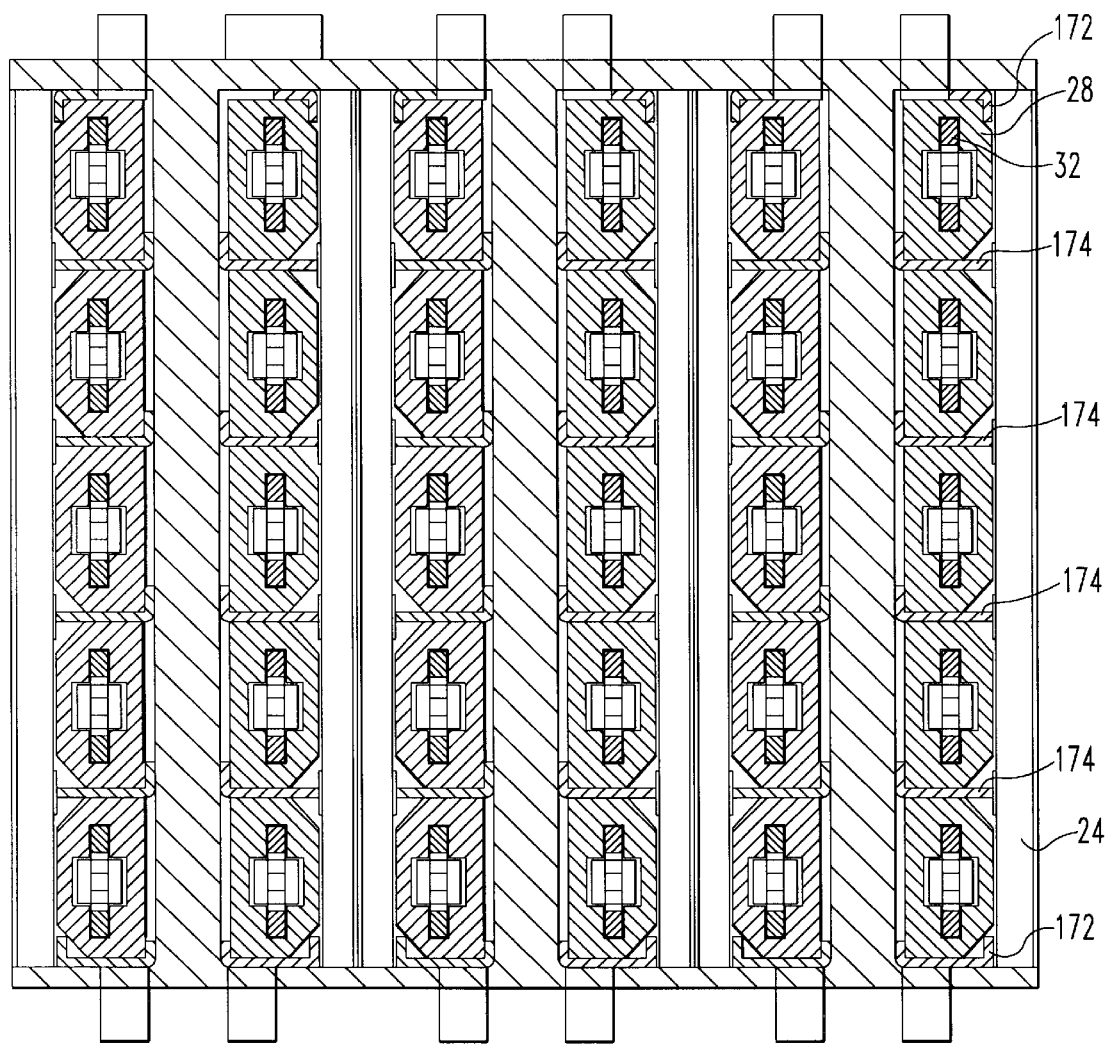
FIG. 12 is a cross-sectional view taken generally along line A—A of FIG. 13.

Referring to FIGS. 11a and 11b, a shielded receptacle carrier is shown therein. In this embodiment, the insulative housing 28 carries a plurality of tuning fork type receptacle contacts 32, as previously described. In addition, a surrounding shield 170 provides electrical shielding of the individual tuning fork contacts 32. Each end of the shield 170 is turned underneath the insulative housing 28 to form hold-down sections 172 (FIG. 12) that are soldered onto the circuit substrate 24. In order to shield individual terminals, tabs 174 (FIG. 12) are punched out of the shield 170 and are bent to extend in slots formed in housing 28 between adjacent terminals 32. The tabs 174 may be soldered onto suitable grounding contact pads formed on the circuit substrate 24. In this manner, effective shielding about individual terminals or groups of terminals may be effected, as shown in FIG. 12.

FIG. 13 is a side sectional view of a right angle receptacle connector received in a mating header connector. As shown, in this arrangement, the contact springs 112 from the shield of the receptacle carrier 26 are positioned to engage the shroud 116 of the header, directly along one edge (at the top) and directly through the ground spring 58 at the bottom. Contact pins 113 are received by the tuning fork contacts 32 and the tips thereof pass by the base section 36 by reason of the offset in the tines 34.

Figure 14A:
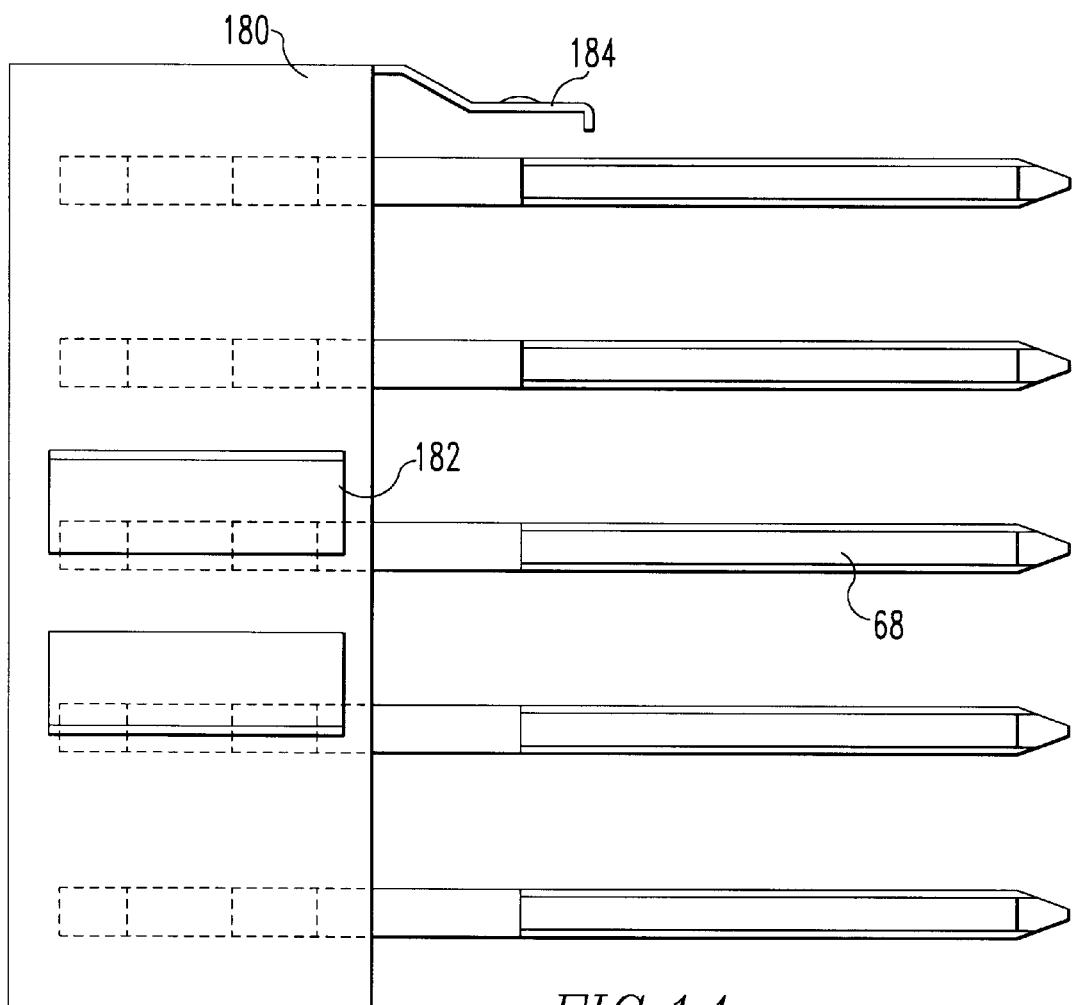

FIGS. 14a and 14b show a shielding arrangement similar to that illustrated in FIG. 11a, 11b and 12, except that the shield 180 is applied to a header carrier as previously illustrated in connection with FIG. 2a. In this arrangement, the shield 180 may have tabs 182 that are punched from the shield and folded, to substantially surround individual or groups of contact pins 68. In addition, contact springs 184 may be integrally formed in the shield 180.

Figure 15:
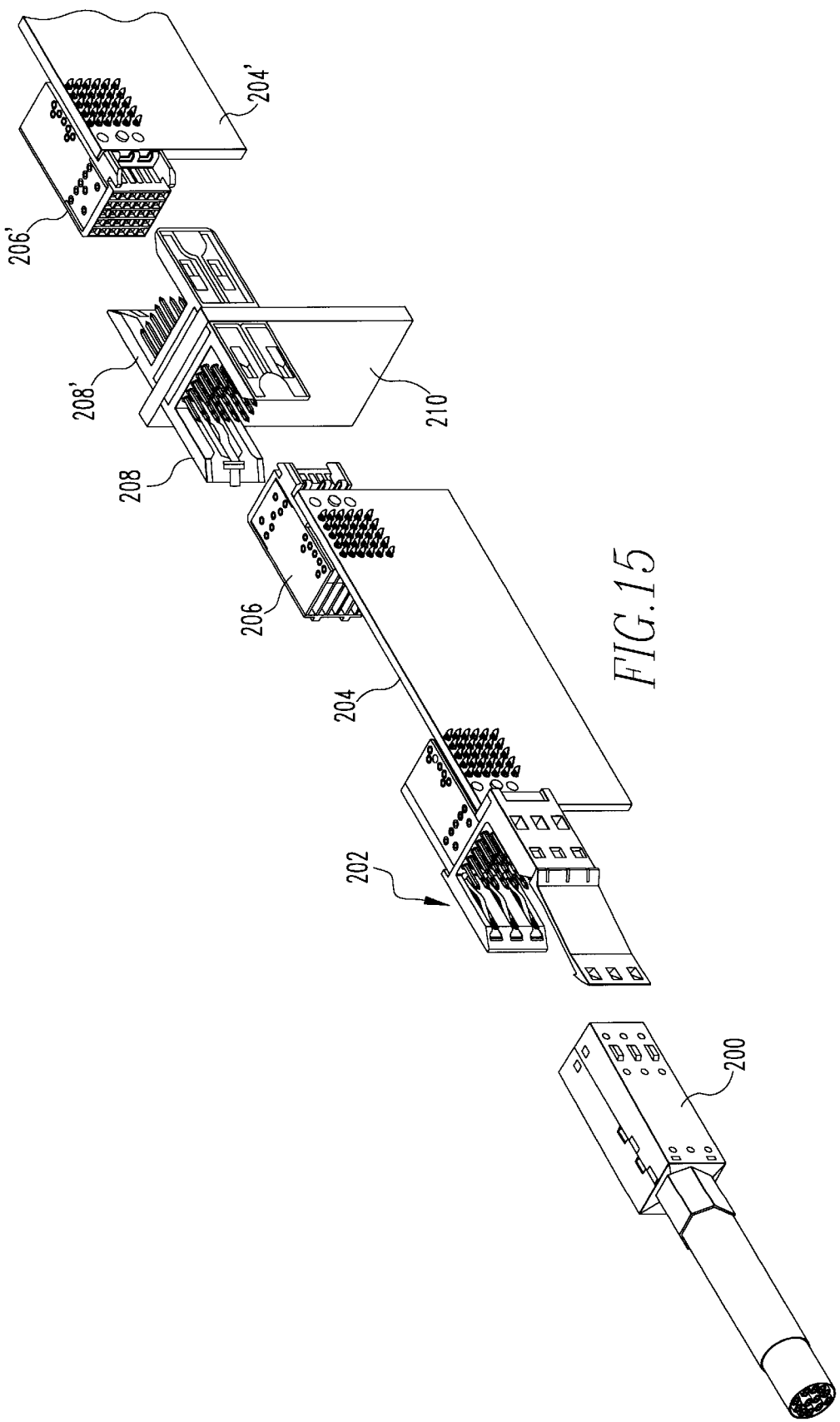
FIG. 15 is an isometric view of an interconnection system made up of several of the connectors illustrated in the proceeding figures.

FIG. 15 shows a cable interconnection arrangement utilizing several of the previously described connectors. If the system is single ended, a cable connector 200 of the type generally illustrated in FIGS. 5a, 5b and 5c is used. For improved high speed capabilities, a shielded receptacle carrier as shown in FIGS. 12a, 12b and 13 is used in cable connector 200. Cable connector 200 mates with a right angle header connector 202 as generally illustrated in FIG. 3b. Again, if improved high speed performance is desired, a shielded pin carrier as shown in FIGS. 14a and 14b is used on the modules forming header 202. Right angle header connector 200 is mounted on one end of a circuit board 204. A right angle receptacle connector 206 of the type illustrated generally in FIG. 1a or, for higher speeds, using a shielded receptacle contact carrier, as shown in FIG. 8a, is used. Receptacle connector 206 is mated with a shielded pin header that extends through a back plane 210 to a mirror image arrangement partially represented by the connectors 208', 206' and circuit board 204'.

Manufacturing costs are improved by the use of terminal carrier assemblies that locate and accurately place multiple terminals simultaneously. Housings for the carriers are formed with flat surfaces that allow placement by pick and place equipment. By the use of the shielding arrangements shown, high speed interconnections with low cost cross talk have be achieved.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An electrical connector having a mating interface and a mounting interface comprising:
    (a) at least one circuit substrate having a body and a plurality of conductive circuit traces carried by the body, the traces extending from a first region of the body adjacent the mating interface to a second region of the body adjacent the mounting interface;
    (b) a plurality of electrical terminals, each associated with one of the traces;
    (c) a housing, formed of electrically insulative material, mounted on the body in at least one of the first and second regions, carrying the terminals, and having a shield member for electrically shielding the terminals, the shield member including portions positioned in shielding relationship with respect to at least one of the terminals; and
    (d) a support maintaining the at least one circuit substrate in a substantially parallel assembled state.

2. An electrical connector as in claim 1, wherein the terminals include surface mount portions for mounting the terminals on the traces.

3. An electrical connector as in claim 1, wherein the shield member secures to the housing onto the circuit substrate by surface mounting techniques.

4. An electrical connector as in claim 1, wherein the terminal has a press fit section and the housing includes a force transmitting portion for receiving an insertion force for pressing the terminal into the circuit substrate and transmitting the insertion force to the terminal.

5. An electrical connector as in claim 1, wherein said plurality of terminals have a deformable element disposed along said mounting interface to establish electrical contact with a circuit element on which the connector is mounted.

6. An electrical connector as in claim 5, wherein the deformable element is heat deformable.

7. An electrical connector as in claim 6, wherein the deformable element is a solder ball.

8. An electrical connector as in claim 1, wherein the housing includes structure for receiving the body and the body is secured to the structure by an interference fit.

9. An electrical connector as in claim 1, wherein an open zone is present on one side of the circuit substrate for receiving electronic elements mounted on the circuit substrate.

10. An electrical connector as in claim 1, wherein the shield member includes at least one tab engaging the support.

11. An electrical connector as in claim 10, further comprising a spring element removably secured to the support and engaged by the tab of the shield member.

12. An electrical connector as in claim 1, wherein the support includes a wall separating adjacent substrates.

13. A method of making an electrical connector comprising:
    (a) forming an electrical circuit substrate element comprising an insulative body having first and second edge portions spaced from each other and a plurality of conductive circuit traces extending from a first region adjacent the first edge to a second region adjacent the second edge;
    (b) forming an electrical connection interface at the region adjacent the first edge by placing a body having a plurality of electrical contact terminals in the first region with each terminal being positioned for attaching to one of the conductive traces;
    (c) electrically connecting each terminal to one of the traces;
    (d) mounting the circuit substrate in a housing to present the contact terminals in a position for mating with a mating connector; and
    (e) shielding at least one of the terminals with a shield member on the housing.

14. The method of claim 13, further comprising the step of securing an electrically conductive element to each of the circuit traces at said second region.

15. The method as in claim 13, wherein the step of electrical connecting each electrical terminal to a circuit trace comprises surface mounting.

16. The method of claim 13, wherein the step of mounting the circuit substrate in the housing includes establishing an interference fit between said body and the housing.

17. An electrical connector having a mating interface and a mounting interface, comprising:
    (a) at least one circuit substrate having a body and a plurality of conductive circuit traces carried by the body, the traces extending from a first region of the body adjacent the mating interface to a second region of the body adjacent the mounting interface;
    (b) a plurality of electrical terminals, each associated with one of the traces;
    (c) a housing formed of electrically insulative material, mounted on the body in at least one of the first and second regions, and having a shield member mounted to the substrate by surface mounting techniques for electrically shielding the terminals; and
    (d) a support for maintaining the at least one circuit substrate in a substantially parallel assembled state.

18. An electrical connector as in claim 17, wherein the shield member includes portions positioned in shielding relationship with respect to at least one of the terminals.

19. An electrical connector as in claim 17, wherein the terminals include surface mount portions for mounting the terminals on the traces.

20. An electrical connector as in claim 17, wherein the terminal has a press fit section and the housing includes a force transmitting portion for receiving an insertion force for pressing the terminal into the circuit substrate and transmitting the insertion force to the terminal.

21. An electrical connector as in claim 17, wherein said plurality of terminals have a deformable element disposed along said mounting interface for establishing electrical contact with a circuit element on which the connector is mounted.

22. An electrical connector as in claim 21, wherein the deformable element is heat deformable.

23. An electrical connector as in claim 22, wherein the deformable element is a solder ball.

24. An electrical connector as in claim 17, wherein the housing includes structure for receiving the body and the body is secured to the structure by an interference fit.

25. An electrical connector as in claim 17, wherein an open zone is present on one side of the circuit substrate for receiving electronic elements mounted on the circuit substrate.

26. An electrical connector as in claim 17, wherein the shield member includes at least one tab engaging the support.

27. An electrical connector as in claim 26, further comprising a spring element removably secured to the support and engaged by the tab of the shield member.

28. An electrical connector as in claim 17, wherein the support includes a wall separating adjacent substrates.

29. A method of making an electrical connector as in claim 13, wherein the shield member mounts to the body using surface mount techniques.

* * * * *